(12) United States Patent
Summerfelt et al.

(10) Patent No.: US 7,968,974 B2
(45) Date of Patent: Jun. 28, 2011

(54) SCRIBE SEAL CONNECTION

(75) Inventors: Scott R. Summerfelt, Garland, TX (US); Thomas D. Bonifield, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 320 days.

(21) Appl. No.: 12/201,394

(22) Filed: Aug. 29, 2008

(65) Prior Publication Data
US 2009/0321889 A1    Dec. 31, 2009

Related U.S. Application Data

(60) Provisional application No. 61/076,472, filed on Jun. 27, 2008.

(51) Int. Cl.
*H01L 23/02* (2006.01)

(52) U.S. Cl. ......... 257/620; 257/E21.523; 257/E21.532; 438/460; 438/462

(58) Field of Classification Search ................ 257/620, 257/E21.523, E21.532; 438/460, 462
See application file for complete search history.

(56) References Cited

U.S. PATENT DOCUMENTS

| | | | |
|---|---|---|---|
| 6,022,791 A * | 2/2000 | Cook et al. | 438/458 |
| 6,163,065 A * | 12/2000 | Seshan et al. | 257/620 |
| 6,365,958 B1 * | 4/2002 | Ibnabdeljalil et al. | 257/620 |
| 2002/0125577 A1 * | 9/2002 | Komada | 257/774 |
| 2003/0122220 A1 * | 7/2003 | West et al. | 257/620 |
| 2004/0150070 A1 * | 8/2004 | Okada et al. | 257/508 |
| 2004/0195582 A1 * | 10/2004 | Tomita et al. | 257/127 |
| 2004/0217477 A1 * | 11/2004 | Tsai et al. | 257/758 |
| 2005/0098893 A1 * | 5/2005 | Tsutsue et al. | 257/758 |
| 2005/0191845 A1 * | 9/2005 | Takada | 438/622 |
| 2006/0151875 A1 * | 7/2006 | Lin et al. | 257/713 |
| 2007/0029641 A1 * | 2/2007 | Hamatani et al. | 257/620 |
| 2008/0169533 A1 * | 7/2008 | Jeng et al. | 257/620 |

* cited by examiner

*Primary Examiner* — Eugene Lee
*Assistant Examiner* — Peniel M Gumedzoe
(74) *Attorney, Agent, or Firm* — Rose Alyssa Keagy; Wade J. Brady, III; Frederick J. Telecky, Jr.

(57) ABSTRACT

A feedthrough in an IC scribe seal is disclosed. The feedthrough is structured to maintain isolation of components in the IC from mechanical damage and chemical impurities introduced during fabrication and assembly operations. A conductive structure penetrates the scribe seal, possibly in more than one location, connecting an interior region to an exterior region. A feedthrough vertical seal surrounds the conductive element in the IC and connects to the scribe seal. A horizontal diffusion barrier connects to the scribe seal and the feedthrough vertical seal. The feedthrough vertical seal, the horizontal diffusion barrier and the IC substrate form a continuous barrier to chemical impurities around the conductive element in the interior region. The conductive structure includes any combination of a doped region in an active area, an MOS transistor gate layer, and one or more interconnect metal layers. The feedthrough is compatible with aluminum and copper interconnect metallization.

32 Claims, 6 Drawing Sheets

SCRIBE SEAL CONNECTION

FIELD OF THE INVENTION

This invention relates to the field of integrated circuits. More particularly, this invention relates to scribe seals of integrated circuits.

DETAILED DESCRIPTION

Figure 1:
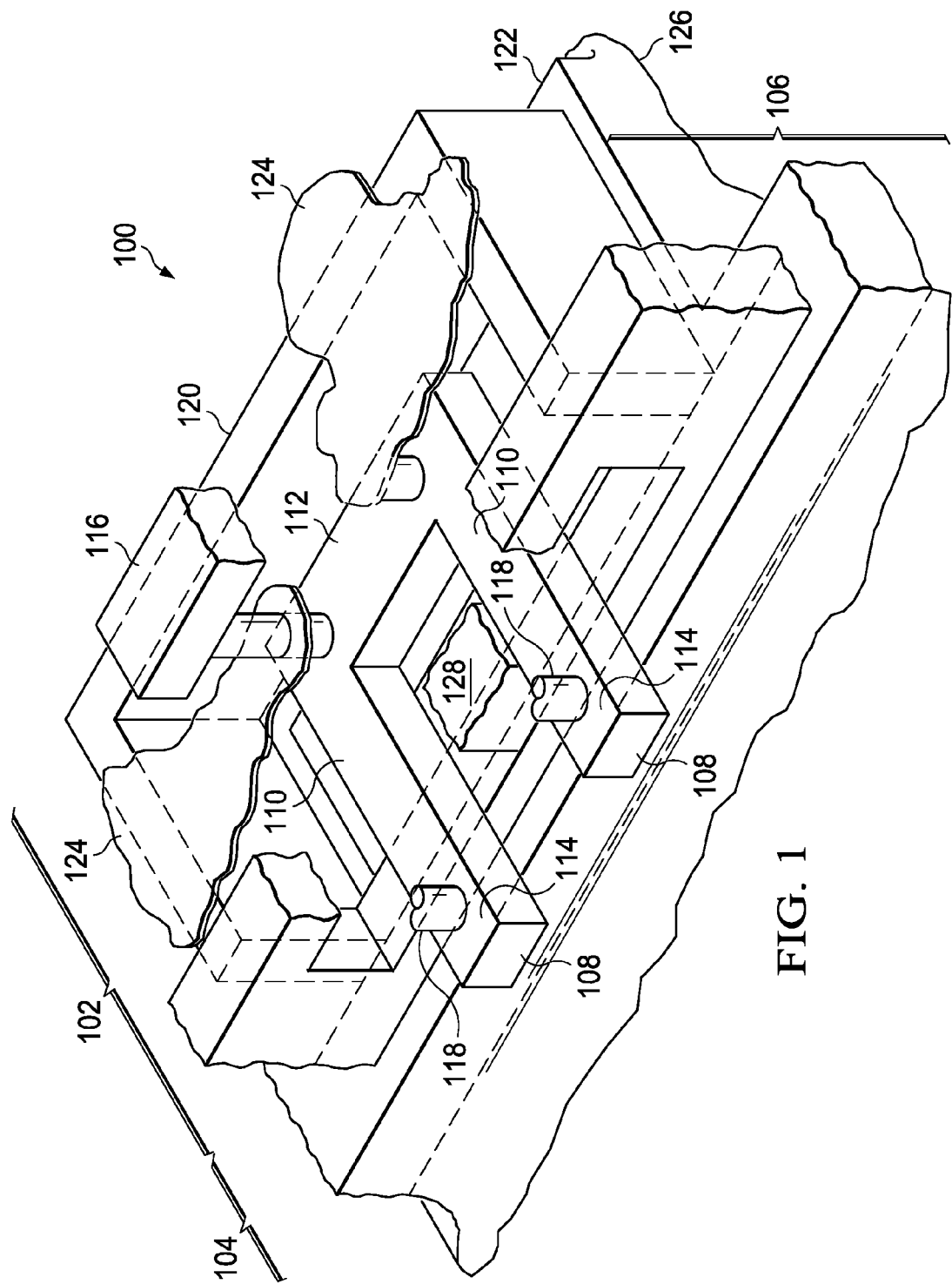
FIG. 1 is a cutaway perspective view showing the principal elements of the instant invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders or concurrently with other acts or events. Furthermore, not all illustrated acts or events are required to implement a methodology in accordance with the present invention.

For the purposes of this disclosure, the term "wafer" is understood to mean any structure of semiconductor material on which one or more ICs may be fabricated. The term wafer as used in this disclosure may refer to a round slice of single crystal silicon from an ingot, a composite structure including an epitaxial layer, a silicon-on-insulator (SOI) structure, a hybrid orientation technology (HOT) structure which includes regions of different crystal orientations, or other structure appropriate for IC fabrication. A wafer includes at least one interior region which contains components and circuits of an IC, and at least one exterior region outside the interior region, such as wafer material between adjacent ICs, sometimes referred to as scribeline area.

For the purposes of this disclosure, the term "substrate" is understood to mean a single crystal semiconductor region at a top surface of a wafer, in which components of an IC are formed.

The instant invention provides an electrical feedthrough in a scribe seal that surrounds an integrated circuit (IC) and maintains isolation of components in the IC from mechanical damage and chemical impurities. Mechanical damage and chemical impurities are commonly introduced during test, assembly and packaging operations such as wafer sawing, encapsulation and bump bonding. Electrical components in an interior region of the IC are electrically connected by the inventive feedthrough to other electrical components in an exterior region outside the IC, for example a scribeline adjacent to the IC.

The feedthrough includes three essential parts: a conductive structure, a vertical seal and a horizontal diffusion barrier. The conductive structure further includes three segments: one or more penetrating segments which cross through the scribe seal, an interior segment located in the interior region, and an exterior segment located in the exterior region. The vertical seal partially surrounds the interior segment and connects to the scribe seal on each side of the penetrating segments. The horizontal diffusion barrier connects to the scribe seal and vertical seal in the interior region above or below the interior segment.

The feedthrough vertical seal and the horizontal diffusion barrier form a barrier to chemical impurities around the interior segment of the conductive structure. The penetrating segments cross the scribe seal in separate locations, allowing a reduction of width of each penetrating segment, thereby desirably improving a mechanical strength of the feedthrough and reducing propagation of cracks and other mechanical damage during a wafer sawing operation and subsequent assembly operations.

FIG. 1 is a cutaway perspective view showing the principal elements of the instant invention. A wafer (100) includes a substrate 126 containing an active area 122. The active area 122 includes an IC interior region (102) and an exterior region (104). The interior region (102) and the exterior region (104) are separated by a scribe seal (106). A conductive structure (108) includes one or more penetrating segments (110) which penetrate the scribe seal (106), an interior segment (112) in the interior region (102) and an exterior segment (114) in the exterior region (104). Interior electrical connections (116) connect the interior segment (112) to other components (not shown) in the interior region (102). Exterior electrical connections (118) connect the exterior segment (114) to components or test pads (not shown) in the exterior region (104). A feedthrough vertical seal (120) forms a continuous barrier laterally around the interior segment (112) of the conductive structure (108). The feedthrough vertical seal (120) connects to the scribe seal (106) on each side of the conductive structure (108). A horizontal diffusion barrier (124) is formed above the conductive structure (108), as depicted in FIG. 1, or below the conductive structure (108). The horizontal diffusion barrier (124) connects to the feedthrough vertical seal (120) and to the scribe seal (106). The feedthrough vertical seal (120) and the horizontal diffusion barrier (124) connect with the scribe seal (106) to form a barrier to chemical impurities around the conductive structure (108) in the interior region (102). Elements of the interior electrical connections (116) are formed of materials which reduce diffusion of chemical impurities in locations where these elements may penetrate the horizontal diffusion barrier (124). In a preferred embodiment, the barrier formed by the feedthrough vertical seal (120) and the horizontal diffusion barrier (124) is continuous.

Portions of the scribe seal (106) may be formed between the penetrating segments (110) to further reduce diffusion of impurities into the interior region (102), as depicted in FIG. 1 by optional scribe seal element (128).

Figure 2A:
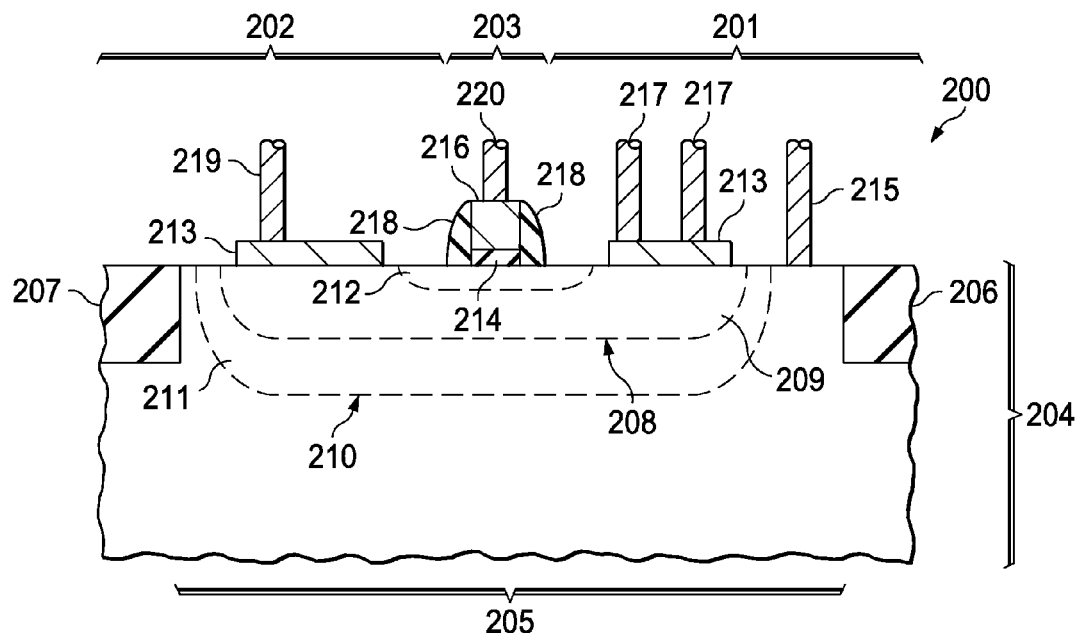
FIG. 2A through FIG. 2D are cross-sections of wafers depicting different embodiments of conductive structures.
Figure 2B:
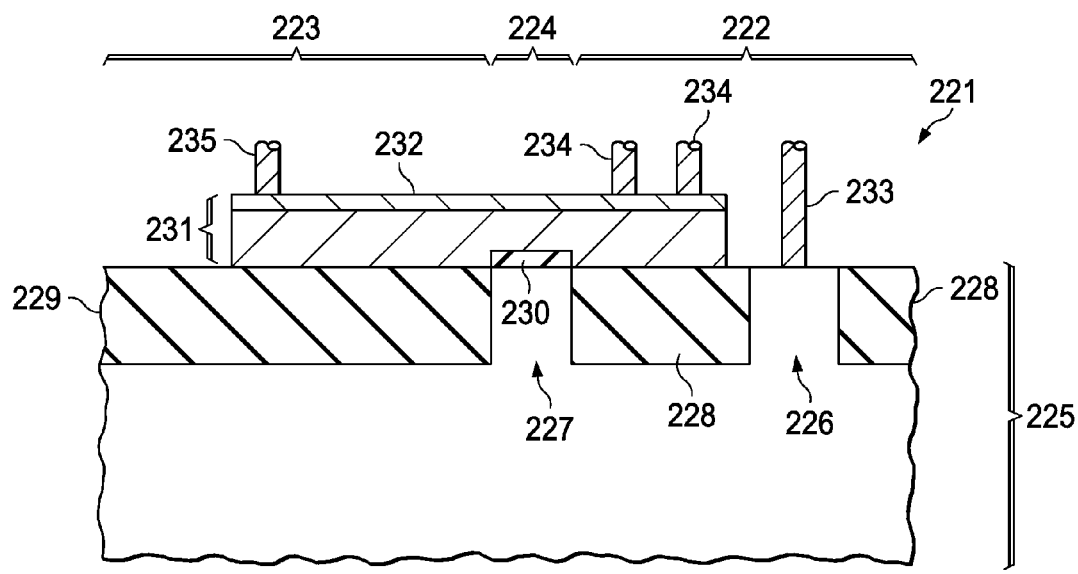
Figure 2C:
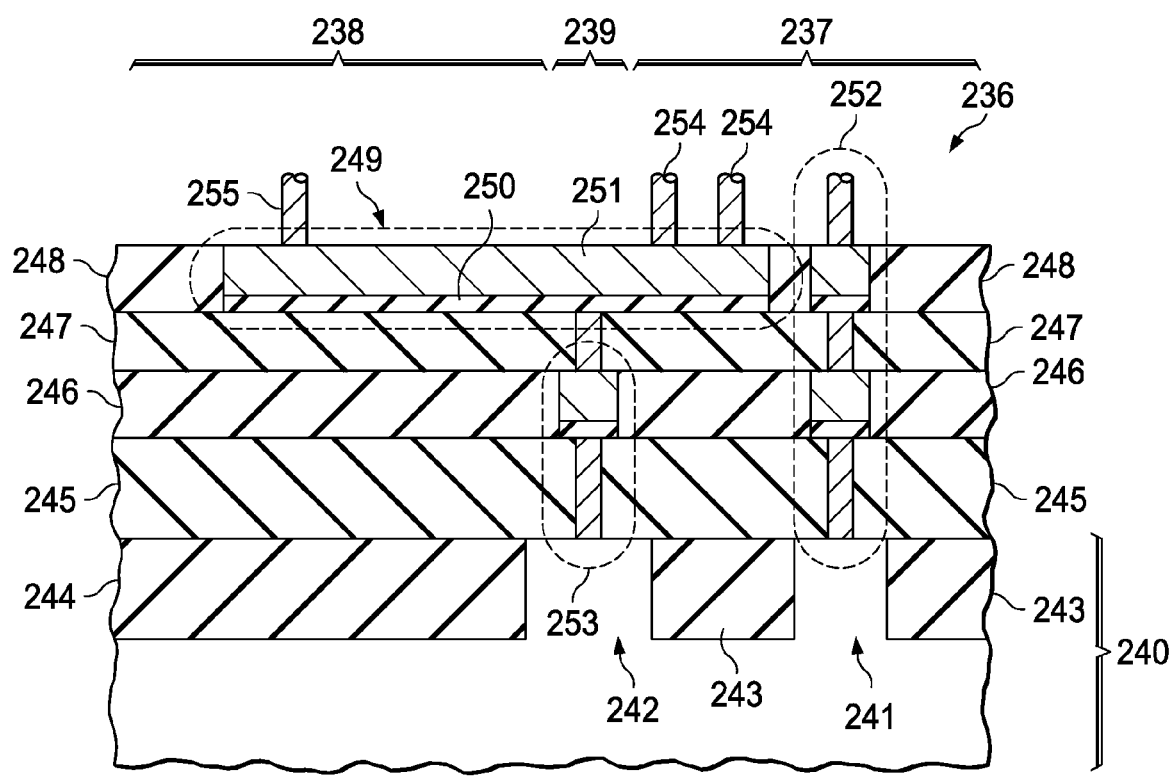

FIG. 2A through FIG. 2C are cross-sections of wafers depicting different embodiments of conductive structures. The conductive structure includes any combination of a doped region in an active area, an element of an MOS transistor gate layer, and one or more interconnect metal layers.

Referring to FIG. 2A, a wafer (200) includes an interior region (201) and an exterior region (202), separated by a scribe seal region (203). The wafer (200) includes a substrate (204) containing an active area (205), an optional interior field oxide region (206) and an optional exterior field oxide region (207). A conductive structure (209) is formed by adding dopants to the active area (205) in a region defined for the conductive structure (209), preferably by ion implantation followed by thermal activation, but possibly by diffusion from an external source. In a preferred embodiment, a doping density of the conductive structure (209) is between $10^{16}$ and $10^{22}$ cm$^{-3}$, and a depth of the conductive structure (209) is between 50 and 1000 nanometers. The conductive structure (209) extends through the scribe seal region (203) into the interior region (201) and into the exterior region (202).

In one embodiment, a conductivity type of the conductive structure (209) is opposite a conductivity type of the active area (205), so that the conductive structure (209) is electrically isolated from the active area (205) by a pn junction (208) at a boundary between of the conductive structure (209) and the active area (205).

In another embodiment, a conductivity type of the conductive structure (209) is the same as a conductivity type of the active area (205). An isolation well (211) of an opposite conductivity type from the conductive structure (209) and the active area (205) is formed in the active area (205). The isolation well (211) surrounds the conductive structure (209). The conductive structure (209) is electrically isolated from the active area (205) by a combination of a first pn junction (208) at a boundary between of the conductive structure (209) and the isolation well (211) and a second pn junction (210) at a boundary between of the isolation well (211) and the active area (205).

An optional upper isolation well (212) may be formed in the active area (205) of an opposite conductivity type as the conductive structure (209). In a preferred embodiment, the conductive structure (209) is electrically isolated from a top surface of the active area (205) in the scribe seal region (203). Isolating the conductive structure (209) from the top surface of the active area (205) in the scribe seal region (203) advantageously allows scribe seal segments to be formed on the top surface of the active area (205), thereby reducing diffusion of chemical impurities into the interior region (201).

The conductive structure (209) may include an optional layer of metal silicide (213) formed on a top surface of the conductive structure (209), for example by depositing a layer of metal, such as nickel, on a top surface of the conductive structure (209), heating the IC (200) to react a portion of the metal with exposed silicon in the conductive structure (209), and selectively removing unreacted metal from the IC (200) surface, commonly by exposing the IC (200) to wet etchants including a mixture of an acid and hydrogen peroxide. In a preferred embodiment, a sheet resistivity of the metal silicide (213) is less than 20 ohms/square. A feedthrough vertical seal (215), a portion of which is depicted in FIG. 2A, is formed on a top surface of the active area (205). Interior electrical connections (217), a portion of which are depicted in FIG. 2A, are formed on a top surface of the conductive structure (209) in the interior region (201). Exterior electrical connections (219), a portion of which are depicted in FIG. 2A, are formed on a top surface of the conductive structure (209) in the exterior region (202). Scribe seal elements (not shown) may be formed in the scribe seal region (203) above the conductive structure (209).

In a specific embodiment, a feedthrough isolation dielectric layer (214) may be formed on a top surface of the conductive structure (209) in the scribe seal region (203). The feedthrough isolation dielectric layer (214) is preferably 1 to 30 nanometers of silicon dioxide, nitrogen doped silicon dioxide, silicon oxy-nitride, hafnium oxide, layers of silicon dioxide and silicon nitride, or other insulating material. The feedthrough isolation dielectric layer (214) is preferably formed by any of a variety of gate dielectric formation processes, for example thermal oxidation, plasma nitridation of an oxide layer, or dielectric material deposition by atomic layer deposition (ALD) processes. The feedthrough isolation dielectric layer (214) is preferably formed concurrently with metal oxide semiconductor (MOS) transistor gate dielectric layers (not shown) in the interior region (201). A scribe seal gate (216) is formed on a top surface of the feedthrough isolation dielectric layer (214). The scribe seal gate (216) is preferably polycrystalline silicon, commonly known as polysilicon, or metal, and is preferably formed concurrently with gates of MOS transistors in the interior region (201). Scribe seal sidewall spacers (218) are formed on lateral surfaces of the scribe seal gate (216). The scribe seal sidewall spacers (218) are typically one or more layers of silicon nitride or silicon dioxide with a total thickness between 30 and 200 nanometers. The scribe seal sidewall spacers (218) are preferably formed concurrently with MOS gate sidewall spacers in MOS transistors in the interior region (201). A scribe seal continuous contact element (220) may be formed on a top surface of the scribe seal gate level element (216) and connect with the scribe seal at points above and below the plane of FIG. 2A.

FIG. 2B depicts another embodiment of a conductive structure. A wafer (221) includes an interior region (222) and an exterior region (223), separated by a scribe seal region (224). The wafer (221) includes a substrate (225) containing a feedthrough seal active area (226) in the interior region (222), an optional scribe seal active area (227) in the scribe seal region (224), optional interior field oxide regions (228) adjacent to the feedthrough seal active area (226) in the interior region (222) and an exterior field oxide region (229) in the exterior region (223). A feedthrough isolation dielectric layer (230) with the properties described in reference to FIG. 2A, is formed on a top surface of the optional scribe seal active area (227), if present. A conductive structure (231) is formed on a top surface of the exterior field oxide region (229), a top surface of the feedthrough isolation dielectric layer (230) if present and a top surface of an interior field oxide region (228). The conductive structure (231) is formed of gate material for MOS transistors, for example polysilicon, and is preferably formed concurrently with gates of MOS transistors in the interior region (222). In an embodiment in which MOS transistors in the interior region (222) have metal gates, the conductive structure (231) would preferably be formed of a same material structure as the metal gates, and preferably be formed concurrently with the metal gates. The conductive structure (231) may include an optional layer of metal silicide (232) formed on a top surface of the conductive structure (231), as described in reference to FIG. 2A.

A feedthrough vertical seal (233) (a portion of which is depicted in FIG. 2B) is formed on a top surface of the feedthrough seal active area (226). Interior electrical connections (234) (a portion of which are depicted in FIG. 2B) are formed on a top surface of the conductive structure (231) in the interior region (222). Exterior electrical connections (235) (a portion of which are depicted in FIG. 2B) are formed on a top surface of the conductive structure (231) in the exterior region (223). Scribe seal elements (not shown) may be formed in the scribe seal region (224) above the conductive structure (231).

FIG. 2C depicts yet another embodiment of a conductive structure. An IC wafer (236) includes an interior region (237) and an exterior region (238), separated by a scribe seal region (239). The wafer (236) includes a substrate (240) containing a feedthrough seal active area (241) in the interior region (237), an optional scribe seal active area (242) in the scribe seal region (239), interior field oxide regions (243) adjacent to the feedthrough seal active area (241) in the interior region (237) and an exterior field oxide region (244) in the exterior region (238).

A pre-metal dielectric (PMD) stack (245) is formed on a top surface of the feedthrough seal active area (241), the optional scribe seal active area (242) if present, the interior field oxide region (243) and the exterior field oxide region (244). The PMD stack (245) is typically a dielectric layer stack including a diffusion resistant PMD liner, a PMD layer of silicon dioxide based dielectric material, and an optional PMD cap. The PMD liner is typically 10 to 100 nanometers of silicon nitride or silicon dioxide, deposited by chemical vapor deposition (CVD) or plasma enhanced chemical vapor deposition (PECVD) processes. The PMD layer is typically 100 to 1000 nanometers of silicon dioxide, phospho-silicate glass (PSG) or boro-phospho-silicate glass (BPSG), deposited by PECVD, and commonly leveled by a chemical-mechanical polish (CMP) process. The optional PMD cap is commonly 10 to 100 nanometers of a diffusion resistant material such as silicon nitride, silicon oxy-nitride, silicon carbide, silicon carbide nitride silicon oxy-carbide or silicon oxy-nitride carbide.

A first intra-metal dielectric (IMD) layer (246) is formed on a top surface of the PMD layer (245). The first IMD layer (246) is typically a dielectric stack including a diffusion resistant etch stop layer, an isolation layer, and an optional diffusion resistant IMD cap layer. The etch stop layer is commonly 2 to 20 nanometers of silicon nitride, silicon oxy-nitride, silicon carbide, silicon carbide nitride silicon oxy-carbide or silicon oxy-nitride carbide, formed by chemical vapor deposition (CVD) or PECVD processes. The isolation layer is commonly 50 to 200 nanometers of silicon dioxide, organo-silicate glass (OSG), carbon-doped silicon oxides (SiCO or CDO) or methylsilsesquioxane (MSQ). The optional IMD cap layer is commonly 2 to 20 nanometers of silicon nitride, silicon oxy-nitride, silicon carbide, silicon carbide nitride silicon oxy-carbide or silicon oxy-nitride carbide, also formed by CVD or PECVD processes.

An inter-level dielectric (ILD) layer (247) is formed on a top surface of the first IMD layer (246). The ILD layer (247) is also typically a dielectric stack including a diffusion resistant etch stop layer, an isolation layer, and an optional ILD cap. The etch stop layer is commonly 2 to 20 nanometers of silicon nitride, silicon oxy-nitride, silicon carbide, silicon carbide nitride silicon oxy-carbide or silicon oxy-nitride carbide formed by CVD or PECVD processes. The isolation layer is commonly 50 to 200 nanometers of silicon dioxide, OSG, SiCO or CDO or MSQ. The optional ILD cap is commonly 2 to 20 nanometers of silicon nitride, silicon oxy-nitride, silicon carbide, silicon carbide nitride silicon oxy-carbide or silicon oxy-nitride carbide, also formed by CVD or PECVD processes.

A second IMD layer (248) is formed on a top surface of the ILD layer (247). The second IMD layer (248) is commonly formed of similar materials and dimensions, and using similar processes, as the first IMD layer (246).

A conductive structure (249) is formed in the second IMD layer (248). The conductive (249) structure includes a feedthrough conductive liner (250) and a feedthrough conductive metal (251). The conductive structure (249) may be formed concurrently with interconnect elements in the interior region (237). In a preferred embodiment, the feedthrough conductive metal (251) is formed of copper and the feedthrough conductive liner (250) is formed of a barrier material such as tantalum nitride. The feedthrough conductive metal (251) and the feedthrough conductive liner (250) may be formed by a process of etching a trench in the second IMD layer (248), depositing a liner layer of tantalum nitride in the trench and on a top surface of the second IMD layer (248), depositing copper in the trench and on a top surface of the tantalum nitride, followed by selective removal of the copper and the tantalum nitride from the top surface of the second IMD layer (248) by CMP processes.

In another embodiment, the feedthrough conductive metal (251) is formed of aluminum and the feedthrough conductive liner (250) may be formed of a barrier material such as titanium nitride. The feedthrough conductive metal (251) and feedthrough conductive liner (250) may be formed by a process of depositing a first layer of titanium nitride on a top surface of the ILD layer (247), depositing a layer of aluminum on a top surface of the first layer of titanium nitride and depositing a second layer of titanium nitride on a top surface of the aluminum. An interconnect photoresist pattern is then formed on a top surface of the second titanium nitride layer to define areas for the interconnect metal elements and interconnect liner elements. Material in the first layer of titanium nitride, the layer of aluminum and the second layer of titanium nitride is removed by etching areas exposed by the interconnect photoresist pattern. The interconnect photoresist pattern is removed. A conformal layer of silicon dioxide is deposited on the remaining titanium nitride and aluminum by thermal decomposition of tetraethyl orthosilicate (also known as tetraethoxysilane or TEOS) followed by deposition of the second IMD layer (248).

Elements of a feedthrough vertical seal (252) are formed on a top surface of the feedthrough seal active area (241) and extending upward through the PMD layer (245), the first IMD layer (246), the ILD layer (247) and the second IMD layer (248). Elements of a scribe seal (253) are optionally formed in the scribe seal region below the conductive structure (249). Additional scribe seal elements (not shown) may be formed in the scribe seal region (239) above the conductive structure (249). Interior electrical connections (254) (a portion of which are depicted in FIG. 2C) are formed on a top surface of the feedthrough conductive metal (251) in the interior region (237). Exterior electrical connections (255) (a portion of which are depicted in FIG. 2C) are formed on a top surface of the feedthrough conductive metal (251) in the exterior region (238).

In an alternate embodiment, a conductive structure may be formed of another conductive metal element and another conductive liner element in the first IMD level (246) or a higher IMD level (not shown).

Furthermore, in yet a further embodiment, a conductive structure may be formed by any combination of a doped region in an active area, an MOS transistor gate layer on field oxide, and one or more metal interconnect layers, appropriately connected together electrically.

Figure 2D:
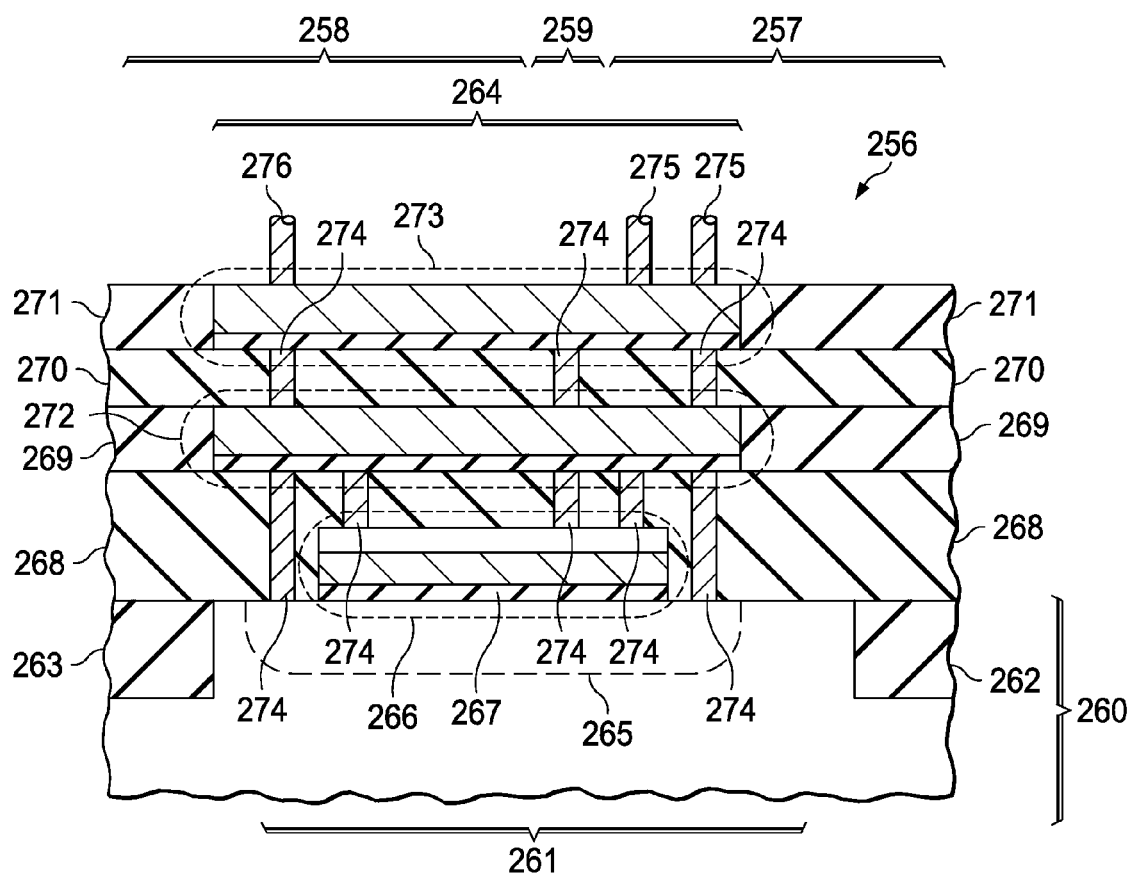

FIG. 2D depicts an embodiment of a conductive structure which includes a doped region in an active area, an element of an MOS transistor gate layer, and interconnect metal elements. An IC wafer (256) includes an interior region (257) and an exterior region (258), separated by a scribe seal region (259). The wafer (256) includes a substrate (260) containing an active area (261), an optional interior field oxide region (262) and an optional exterior field oxide region (263). The conductive structure (264) includes a doped region (265) formed in the active area (261) as described in reference to FIG. 2A. The conductive structure (264) further includes an MOS gate element (266) formed on a top surface of the active area (261) as described in reference to FIG. 2B. The MOS gate element (266) may include an optional gate dielectric layer (267), similar to that described in reference to FIG. 2A, contacting the top surface of the active area (261). A PMD stack (268) is formed on an existing top surface of the IC wafer (256), as described in reference to FIG. 2C. A first IMD layer (269) is formed on a top surface of the PMD stack (268) as described in reference to FIG. 2C. An ILD layer (270) is formed on a top surface of the first IMD layer (269) as described in reference to FIG. 2C. A second IMD layer (271) is formed on a top surface of the ILD layer (270) as described in reference to FIG. 2C. The conductive structure (264) further includes a first interconnect metal element (272) formed in the first IMD layer (269), and a second interconnect element (273) formed in the second IMD layer (271), as described in reference to FIG. 2C. Vertical metal interconnects (274) provide electrical connections between the doped region (265), the MOS gate element (266), the first interconnect metal element (272) and the second interconnect element (273). Interior electrical connections (275) (a portion of which are depicted in FIG. 2D) are formed on the conductive structure (264) in the interior region (257), as described in reference to FIG. 2A through FIG. 2D. Exterior electrical connections (276) (a portion of which are depicted in FIG. 2D) are formed on the conductive structure (264) in the exterior region (258), as described in reference to FIG. 2A through FIG. 2D.

Figure 3:
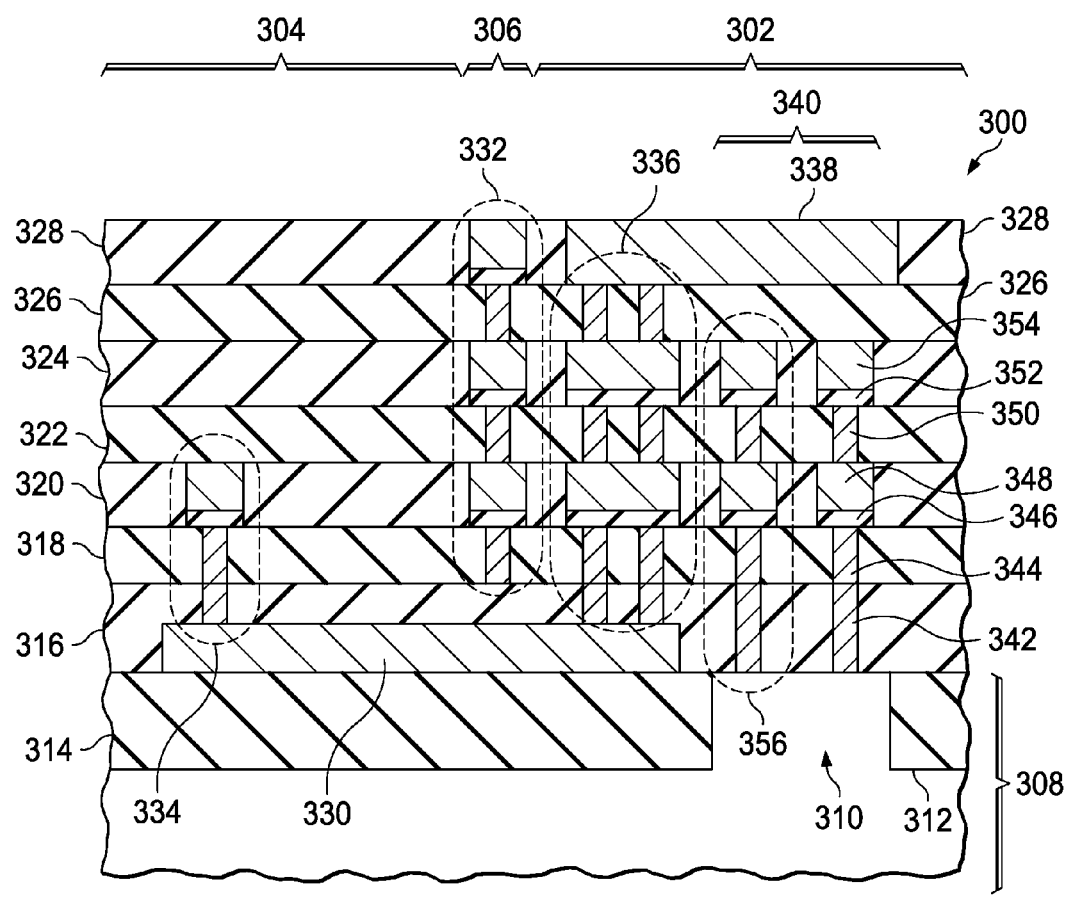
FIG. 3 is a cross-section of a wafer depicting embodiments of feedthrough vertical seals.

FIG. 3 is a cross-section of a wafer depicting embodiments of feedthrough vertical seals. The feedthrough vertical seal includes one or more vertically continuous stacks of sealing elements which are formed of continuous linear contact metal structures, metal interconnect layers and continuous linear interconnect via structures. Elements of the scribe seal may be formed above or below the feedthrough element to provide additional protection from chemical impurities and mechanical damage. The instant invention is preferably formed using copper interconnects but may be formed using aluminum interconnects or other metallization scheme. The wafer (300) includes an interior region (302) and an exterior region (304), separated by a scribe seal region (306). The wafer (300) includes a substrate (308) containing a feedthrough seal active area (310) in the interior region (302), an interior field oxide region (312) in the interior region (302) adjacent to the feedthrough seal active area (310) and an exterior field oxide region (314) in the exterior region (304). A PMD stack (316) is formed on a top surface of the feedthrough seal active area (310), the interior field oxide region (312) and the exterior field oxide region (314), as described in reference to FIG. 2C. An optional second PMD stack (318) is formed on a top surface of the first PMD layer (316). The optional second PMD stack (318) is typically a layer stack including a second PMD diffusion resistant layer, a second PMD layer of silicon dioxide based dielectric material, and an optional second PMD cap. The second PMD diffusion resistant layer is commonly 5 to 20 nanometers of silicon nitride, silicon oxynitride, silicon carbide, silicon carbide nitride silicon oxycarbide, silicon oxy-nitride carbide or aluminum oxide, deposited using PVD, CVD, PECVD or metal organic chemical vapor deposition (MOCVD) processes. The second PMD layer is commonly 30 to 150 nanometers of silicon dioxide deposited by CVD or PECVD processes. The optional second PMD cap has the properties of the PMD cap described in reference to the PMD layer depicted in FIG. 2C. A first IMD layer (320) is formed on a top surface of the PMD layer (316) (or the second PMD layer (318) if present) as described in reference to FIG. 2C. A first ILD layer (322) is formed on a top surface of the first IMD layer (320) as described in reference to FIG. 2C. A second IMD layer (324), with similar properties as the first IMD layer (320), is formed on a top surface of the first ILD layer (322). A second ILD layer (326), with similar properties as the first ILD layer (322), is formed on a top surface of the second IMD layer (324). A third IMD layer (328), with similar properties as the second IMD layer (324), is formed on a top surface of the second ILD layer (326).

A conductive structure (330) is formed on the wafer (300), as described in reference to FIG. 2A through FIG. 2C. The conductive structure (330) may be any combination of a doped region in an active area, an MOS transistor gate layer on field oxide, and one or more metal interconnect layers, appropriately connected together electrically. Components of a scribe seal (332) may optionally be formed over the conductive structure (330) in the scribe seal region (306). Exterior electrical connections (334), a portion of which are depicted in FIG. 3, are formed on a top surface of the conductive structure (330) in the exterior region (304). Interior electrical connections (336) are formed on a top surface or a bottom surface of the conductive structure (330) in the interior region (302). The interior electrical connections (336) connect to an IC feedthrough terminal (338), which in turn connects to components (not shown) in the IC.

A feedthrough vertical seal (340) is formed over a top surface of the feedthrough seal active area (310). The feedthrough vertical seal (340) may include a continuous first contact seal element (342) formed in the PMD layer (316). The first contact seal (342) is preferably formed by defining a continuous contact area on a top surface of the PMD layer (316) with a contact photoresist pattern (not shown). A contact seal trench is formed in the PMD layer (316) by removing PMD layer material using reactive ion etching processes to expose the feedthrough seal active area (310). The continuous contact trench is filled with a contact liner metal, such as titanium, and a contact fill metal, typically tungsten. The contact fill metal and the contact liner metal on the top surface of the PMD layer (316) is removed using etchback or CMP methods. The first contact seal (342) connects to the scribe seal on each side of the conductive structure (330) (at points above and below the plane of FIG. 3 as depicted by the feedthrough vertical seal (120) in FIG. 1). In a preferred embodiment, the first contact seal element (342) is formed concurrently with contacts (not shown) in the interior region (302).

If the optional second PMD layer (318) is formed, a continuous second contact seal (344) may be formed in the second PMD layer (318) to contact a top surface of the first contact seal (342). The second contact seal (344) may be formed by a process similar to that described for the first contact seal (342). The second contact seal (344) connects to the scribe seal on each side of the conductive structure (330) as described for the first contact seal (342).

A continuous first interconnect seal structure includes a continuous first seal liner (346) and a corresponding continuous first seal metal (348). The first interconnect seal structure may be formed in the first IMD layer (320) so as to make contact to a top surface of the continuous contact seal (342) or the continuous second contact seal (344) if present. The first seal liner (346) and the first seal metal (348) are preferably formed by a process similar to that described in reference to FIG. 2C. The first seal liner (346) and the first seal metal (348) make contact to the scribe seal on each side of the conductive structure (330) as described for the first contact seal (342). A continuous first via seal (350) may be formed in the first ILD layer (322) making contact to a top surface of the continuous first seal metal (348) if present and making contact to the scribe seal on each side of the conductive structure (330) at points above and below the plane of FIG. 3. A continuous second seal liner (352) and a corresponding optional continuous second seal metal (354) may be formed in the second IMD layer (324) making contact to a top surface of the continuous via seal (350) if present, by a process similar to that described in reference to FIG. 2C. Additional continuous via seals and additional continuous seal liners with corresponding continuous seal metals may be formed in the feedthrough vertical seal (340) to extend the feedthrough vertical seal (340) upward.

In a further embodiment, an additional vertical seal stack (356), including possibly another continuous contact seal, possibly another continuous second contact seal, possibly another continuous first seal liner and possibly another corresponding continuous first seal metal, possibly another continuous first via seal, and possibly further seals, may be formed over the top surface of the feedthrough seal active area (310) adjacent to the seal components (342, 344, 346, 348, 350, 352) recited above. The additional vertical seal stack (356), if formed, connects to the scribe seal on each side of the conductive structure (330) as described for the first contact seal (342). The additional vertical seal stack (356) advantageously provides additional protection against chemical impurities. Other embodiments may include additional vertical seal stacks which advantageously provide even more protection against chemical impurities.

The interior electrical connections (336) extend vertically above or below the feedthrough vertical seal (340) so as to avoid breaching or contacting seal elements in the feedthrough vertical seal (340).

Figure 4:
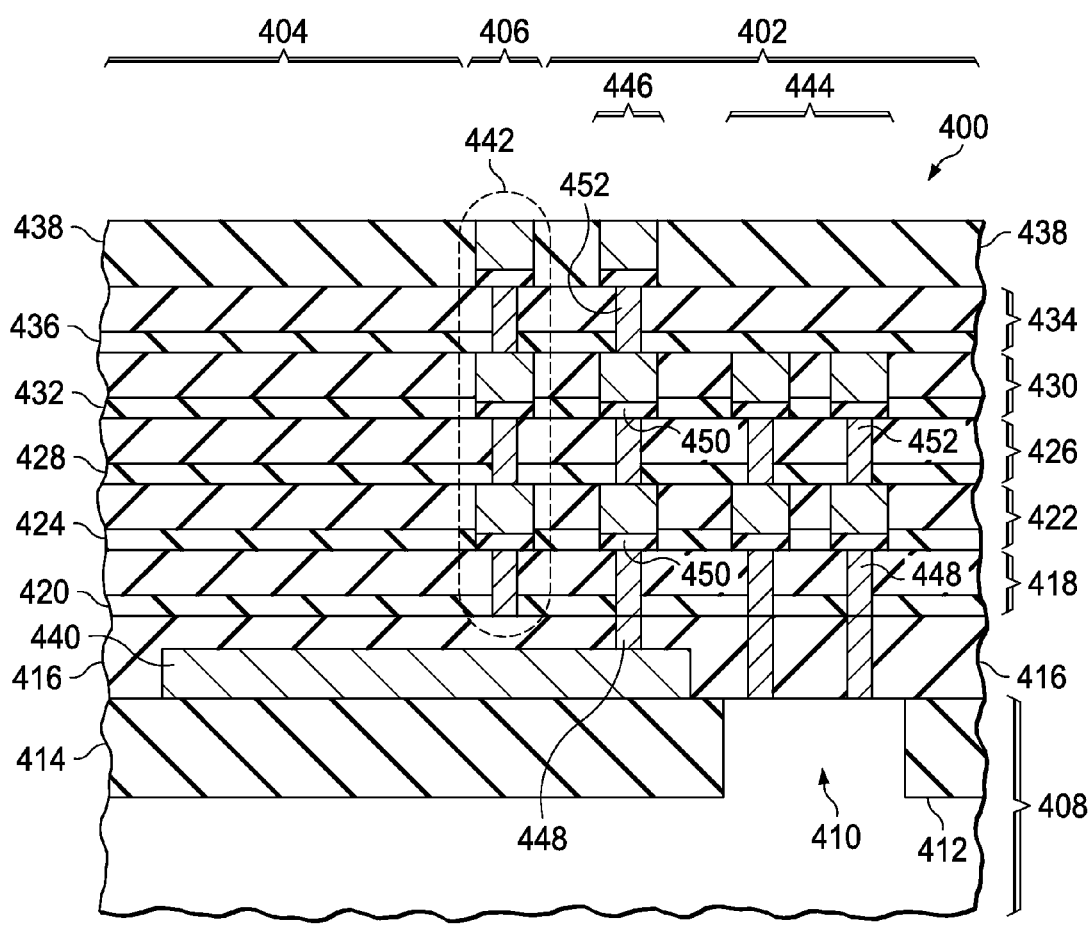
FIG. 4 is a cross-section of a wafer depicting embodiments of horizontal diffusion barriers.

FIG. 4 is a cross-section of a wafer depicting embodiments of horizontal diffusion barriers. The horizontal diffusion barrier includes a substrate of the IC or one or more barrier layer stacks. The barrier layer stacks are formed of sub-layers of materials which retard diffusion of chemical impurities. The barrier layer stacks are preferably formed concurrently with hardmask layers and etch stop layers as part of a fabrication process sequence of the IC. The wafer (400) includes an interior region (402) and an exterior region (404), separated by a scribe seal region (406). The wafer (400) includes a substrate (408) containing a feedthrough seal active area (410) in the interior region (402). An optional interior field oxide region (412) may be formed in the interior region (402) adjacent to the feedthrough seal active area (410), and an optional exterior field oxide region (414) may be formed in the exterior region (404).

A PMD layer (416) is formed on a top surface of the feedthrough seal active area (410), the interior field oxide region (412) and the exterior field oxide region (414), as described in reference to FIG. 2C. An optional second PMD layer (418) may be formed on a top surface of the PMD layer (416) as described in reference to FIG. 2C. The optional second PMD layer (418), if formed, includes a second PMD diffusion resistant layer (420) of 5 to 20 nanometers of silicon nitride, silicon oxy-nitride, silicon carbide, silicon carbide nitride silicon oxy-carbide, silicon oxy-nitride carbide or aluminum oxide.

A first IMD layer (422) is formed on a top surface of the PMD layer (416) or the second PMD layer (418) if present, as described in reference to FIG. 2C. The first IMD layer (422) includes a first IMD diffusion resistant layer (424) of 2 to 20 nanometers of silicon nitride, silicon oxy-nitride, silicon carbide, silicon carbide nitride silicon oxy-carbide or silicon oxy-nitride carbide.

A first ILD layer (426) is formed on a top surface of the first IMD layer (422) as described in reference to FIG. 2C. The first ILD layer (426) includes a first ILD diffusion resistant layer (428) of 2 to 20 nanometers of silicon nitride, silicon oxy-nitride, silicon carbide, silicon carbide nitride silicon oxy-carbide or silicon oxy-nitride carbide.

A second IMD layer (430) is formed on a top surface of the first ILD layer (426), as described in reference to FIG. 2C. The second IMD layer (430) includes a second IMD diffusion resistant layer (432) of 2 to 20 nanometers of silicon nitride, silicon oxy-nitride, silicon carbide, silicon carbide nitride silicon oxy-carbide or silicon oxy-nitride carbide.

A second ILD layer (434) is formed on a top surface of the second IMD layer (430) as described in reference to FIG. 2C. The second ILD layer (434) includes a second ILD diffusion resistant layer (436) of 2 to 20 nanometers of silicon nitride, silicon oxy-nitride, silicon carbide, silicon carbide nitride silicon oxy-carbide or silicon oxy-nitride carbide.

Additional dielectric layers and diffusion resistant layers, as represented by a third IMD layer (438), may be formed on the second ILD layer (434).

A horizontal diffusion barrier of the instant invention is formed of any combination of the IC substrate (408), the PMD diffusion resistant layer (420), the first IMD diffusion resistant layer (424), the first ILD diffusion resistant layer (428), the second IMD diffusion resistant layer (432), the second ILD diffusion resistant layer (436) and any additional diffusion resistant layers in the interior region (402).

A conductive structure (440) is formed on the wafer (400), as described in reference to FIG. 2A through FIG. 2C. The conductive structure (440) may be any combination of a doped region in an active area, an MOS transistor gate layer on field oxide, and one or more metal interconnect layers, appropriately connected together electrically. Scribe seal elements (442) may be formed above or below the conductive structure (440) in the scribe seal region (406). A feedthrough vertical seal (444) is formed over a top surface of the feedthrough seal active area (410) as described in reference to FIG. 3. In a preferred embodiment, each diffusion resistant layer continuously contacts a feedthrough vertical seal segment in the feedthrough vertical seal (444) along a length of the seal element so as to advantageously minimize diffusion of chemical impurities into the IC.

Additional metal interconnect elements, as represented by interior electrical connection (446) may be formed among the diffusion resistant layers between the feedthrough vertical seal (444) and the scribe seal region (406). In a preferred embodiment, contacts (448), liner elements (450) and vias (452) make continuous contact to a diffusion resistant layer along perimeters of the contacts (448), liner elements (450) and vias (452) so as to advantageously minimize diffusion of chemical impurities into the IC. A configuration in which horizontal diffusion resistant layers connect to contact elements, via elements and metal liner elements so as to form a diffusion barrier with no gaps or openings is advantageous because penetration of chemical impurities through a scribe seal around penetrating segments of a conductive structure may be reduced.

What is claimed is:

1. An integrated circuit wafer including a feedthrough, comprising:
    a scribe seal;
    an electrically conductive structure through said scribe seal, said conductive structure further including:
        an exterior segment;
        a plurality of penetrating segments whereby said penetrating segments cross said scribe seal in said integrated circuit wafer and are electrically connected to said exterior segment; and an interior segment electrically connected to said penetrating segments;

a horizontal diffusion barrier located above or below said interior segment and connected to said scribe seal; and a feedthrough vertical seal partially surrounding said interior segment, said vertical seal connected to said scribe seal and to said horizontal diffusion barrier.

2. The integrated circuit wafer of claim 1, in which said feedthrough element is selected from the group consisting of:
a doped region in a substrate of said integrated circuit,
a layer of MOS transistor gate material,
at least one metal interconnect layer, and
any combination thereof.

3. The integrated circuit wafer of claim 2, in which said doped region further includes a layer of metal silicide formed at a top surface of said doped region.

4. The integrated circuit wafer of claim 2, in which said layer of MOS transistor gate material further includes a layer of metal silicide formed at a top surface of said layer of MOS transistor gate material.

5. The integrated circuit wafer of claim 2, further including:
a feedthrough isolation dielectric layer formed on a top surface of said doped region under said scribe seal; and
a scribe seal gate formed on a top surface of said feedthrough isolation dielectric layer, such that said scribe seal connects to a top surface of said scribe seal gate.

6. The integrated circuit wafer of claim 2, in which said feedthrough vertical seal further includes a vertically continuous stack of seals, said seals selected from the group consisting of:
a continuous first contact seal,
a continuous second contact seal,
at least one continuous metal interconnect seal,
at least one continuous via seal, and
any combination thereof.

7. The integrated circuit wafer of claim 6, in which said continuous metal interconnect seal further includes:
a continuous seal liner containing tantalum nitride; and
a continuous seal metal containing copper formed on a top surface of said continuous seal liner.

8. The integrated circuit wafer of claim 6, in which said continuous metal interconnect seal further includes:
a continuous seal liner containing titanium nitride; and
a continuous seal metal containing aluminum formed on a top surface of said continuous seal liner.

9. The integrated circuit wafer of claim 6, in which said horizontal diffusion barrier is selected from the group consisting of:
said integrated circuit substrate,
a diffusion resistant PMD liner,
a second PMD diffusion resistant layer,
at least one IMD diffusion resistant layer,
at least one ILD diffusion resistant layer, and
any combination thereof.

10. The integrated circuit wafer of claim 9, in which said second PMD diffusion resistant layer is formed of materials selected from the group consisting of:
silicon nitride,
silicon oxy-nitride,
silicon carbide,
silicon carbide nitride,
silicon oxy-carbide,
silicon oxy-carbide nitride,
aluminum oxide, and
any combination thereof.

11. The integrated circuit wafer of claim 9, in which said IMD diffusion resistant layer is formed of materials selected from the group consisting of:
silicon nitride,
silicon oxy-nitride,
silicon carbide,
silicon carbide nitride,
silicon oxy-carbide,
silicon oxy-carbide nitride, and
any combination thereof.

12. The integrated circuit wafer of claim 9, in which said ILD diffusion resistant layer is formed of materials selected from the group consisting of:
silicon nitride,
silicon oxy-nitride,
silicon carbide,
silicon carbide nitride,
silicon oxy-carbide,
silicon oxy-carbide nitride, and
any combination thereof.

13. The integrated circuit wafer of claim 12, in which said feedthrough vertical seal further includes a second vertically continuous stack of seals, said seals selected from the group consisting of:
a continuous contact seal,
a continuous second contact seal,
at least one continuous metal interconnect seal,
at least one continuous via seal, and
any combination thereof.

14. The integrated circuit wafer of claim 12, whereby a portion of said scribe seal is formed above said penetrating segments.

15. The integrated circuit wafer of claim 12, whereby a portion of said scribe seal is formed below said penetrating segments.

16. The integrated circuit wafer of claim 12, whereby a portion of said scribe seal is formed between said penetrating segments.

17. An integrated circuit having a scribe seal feedthrough, comprising:
a scribe seal;
an electrically conductive structure through said scribe seal, said conductive structure further including:
a plurality of penetrating segments whereby said penetrating segments cross said scribe seal in said integrated circuit; and
an interior segment electrically connected to said penetrating segments;
a horizontal diffusion barrier located above or below said interior segment and connected to said scribe seal; and
a feedthrough vertical seal partially surrounding said interior segment, said vertical seal connected to said scribe seal and to said horizontal diffusion barrier.

18. The integrated circuit of claim 17, in which said feedthrough element is selected from the group consisting of:
a doped region in a substrate of said integrated circuit,
a layer of MOS transistor gate material,
at least one metal interconnect layer, and
any combination thereof.

19. The integrated circuit of claim 18, in which said doped region further includes a layer of metal silicide formed at a top surface of said doped region.

20. The integrated circuit of claim 18, in which said layer of MOS transistor gate material further includes a layer of metal silicide formed at a top surface of said layer of MOS transistor gate material.

21. The integrated circuit of claim 18, further including:
a feedthrough isolation dielectric layer formed on a top surface of said doped region under said scribe seal; and
a scribe seal gate formed on a top surface of said feedthrough isolation dielectric layer, such that said scribe seal connects to a top surface of said scribe seal gate.

22. The integrated circuit of claim 18, in which said feedthrough vertical seal further includes a vertically continuous stack of seals, said seals selected from the group consisting of:
a continuous first contact seal,
a continuous second contact seal,
at least one continuous metal interconnect seal,
at least one continuous via seal, and
any combination thereof.

23. The integrated circuit of claim 22, in which said continuous metal interconnect seal further includes:
a continuous seal liner containing tantalum nitride; and
a continuous seal metal containing copper formed on a top surface of said continuous seal liner.

24. The integrated circuit of claim 22, in which said continuous metal interconnect seal further includes:
a continuous seal liner containing titanium nitride; and
a continuous seal metal containing aluminum formed on a top surface of said continuous seal liner.

25. The integrated circuit of claim 22, in which said horizontal diffusion barrier is selected from the group consisting of:
said integrated circuit substrate,
a diffusion resistant PMD liner,
a second PMD diffusion resistant layer,
at least one IMD diffusion resistant layer,
at least one ILD diffusion resistant layer, and
any combination thereof.

26. The integrated circuit of claim 25, in which said second PMD diffusion resistant layer is formed of materials selected from the group consisting of:
silicon nitride,
silicon oxy-nitride,
silicon carbide,
silicon carbide nitride,
silicon oxy-carbide,
silicon oxy-carbide nitride,
aluminum oxide, and
any combination thereof.

27. The integrated circuit of claim 25, in which said IMD diffusion resistant layer is formed of materials selected from the group consisting of:
silicon nitride,
silicon oxy-nitride,
silicon carbide,
silicon carbide nitride,
silicon oxy-carbide,
silicon oxy-carbide nitride, and
any combination thereof.

28. The integrated circuit of claim 25, in which said ILD diffusion resistant layer is formed of materials selected from the group consisting of:
silicon nitride,
silicon oxy-nitride,
silicon carbide,
silicon carbide nitride,
silicon oxy-carbide,
silicon oxy-carbide nitride, and
any combination thereof.

29. The integrated circuit of claim 28, in which said feedthrough vertical seal further includes a second vertically continuous stack of seals, said seals selected from the group consisting of:
a continuous contact seal,
a continuous second contact seal,
at least one continuous metal interconnect seal,
at least one continuous via seal, and
any combination thereof.

30. The integrated circuit of claim 28, whereby a portion of said scribe seal is formed above said penetrating segments.

31. The integrated circuit of claim 28, whereby a portion of said scribe seal is formed below said penetrating segments.

32. The integrated circuit of claim 28, whereby a portion of said scribe seal is formed between said penetrating segments.

* * * * *